United States Patent
Aga et al.

(10) Patent No.: US 9,029,240 B2
(45) Date of Patent: May 12, 2015

(54) METHOD FOR MANUFACTURING SOI WAFER

(71) Applicant: Shin-Etsu Handotai Co., Ltd., Tokyo (JP)

(72) Inventors: Hiroji Aga, Takasaki (JP); Toru Ishizuka, Takasaki (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 14/394,598

(22) PCT Filed: Apr. 19, 2013

(86) PCT No.: PCT/JP2013/002651
§ 371 (c)(1),
(2) Date: Oct. 15, 2014

(87) PCT Pub. No.: WO2013/175705
PCT Pub. Date: Nov. 28, 2013

(65) Prior Publication Data
US 2015/0064875 A1 Mar. 5, 2015

(30) Foreign Application Priority Data
May 24, 2012 (JP) ................................. 2012-119066

(51) Int. Cl.
H01L 21/30 (2006.01)
H01L 21/46 (2006.01)
H01L 21/762 (2006.01)
H01L 21/306 (2006.01)
H01L 21/265 (2006.01)
H01L 21/322 (2006.01)
H01L 21/20 (2006.01)

(52) U.S. Cl.
CPC .... *H01L 21/76254* (2013.01); *H01L 21/30604* (2013.01); *H01L 21/265* (2013.01); *H01L 21/76256* (2013.01); *H01L 21/3226* (2013.01); *H01L 21/76251* (2013.01); *H01L 21/2007* (2013.01)

(58) Field of Classification Search
None
See application file for complete search history.

(56) References Cited

U.S. PATENT DOCUMENTS 5,494,849 A * 2/1996 Iyer et al. ........................ 438/459
5,668,045 A * 9/1997 Golland et al. ............... 438/459

(Continued)

FOREIGN PATENT DOCUMENTS

| JP | A-08-107091 | 4/1996 |
|---|---|---|
| JP | A-11-016861 | 1/1999 |
| JP | A-2004-022838 | 1/2004 |
| JP | A-2006-216662 | 8/2006 |
| JP | A-2002-305292 | 10/2006 |
| JP | A-2006-270039 | 10/2006 |
| JP | A-2008-526038 | 7/2008 |
| JP | A-2010-199353 | 9/2010 |
| JP | A-2011-071193 | 4/2011 |

OTHER PUBLICATIONS

Jul. 23, 2013 International Search Report issued in International Application No. PCT/JP2013/002651.

*Primary Examiner* — Angel Roman
(74) *Attorney, Agent, or Firm* — Oliff PLC

(57) ABSTRACT

The present invention provides a method for manufacturing an SOI wafer, in which an insulator film is formed at least on all surfaces of a base wafer, and while protecting a first part of the insulator film on a back surface on the opposite side from a bonded surface of the base wafer, a bonded wafer before separating a bond wafer along a layer of the implanted ion is brought into contact with a liquid capable of dissolving the insulator film or exposed to a gas capable of dissolving the insulator film, and a second part of the insulator film interposed between the bond wafer and the base wafer is etched from an outer circumferential edge of the bonded wafer and toward the center of the bonded wafer. The method can control the terrace width and inhibit warping of the SOI wafer in a bonding process with a base wafer.

19 Claims, 2 Drawing Sheets

(56) References Cited

U.S. PATENT DOCUMENTS 5,937,312 A * 8/1999 Iyer et al. .................. 438/459
2004/0219370 A1 11/2004 Aga et al.
2005/0014347 A1 * 1/2005 Tomita et al. ............. 438/459
2009/0095399 A1 4/2009 Zussy et al.
2011/0281420 A1 11/2011 Aga et al.

* cited by examiner

METHOD FOR MANUFACTURING SOI WAFER

TECHNICAL FIELD

The present invention relates to a method for manufacturing an SOI wafer by the ion implantation separation method.

BACKGROUND ART

Conventionally, in an SOI wafer manufactured by the ion implantation separation method, since an SOI layer is not transferred at its outer circumference, a surface of a base wafer is exposed, thereby forming a terrace. The main reason is that since polishing sag occurs at the outer circumference of the wafer and makes wafer flatness worse, the bonding strength between bonded wafers is low, and the SOI layer is hard to be transferred on the base wafer side.

When the terrace of an SOI wafer is observed with an optical microscope, an SOI island, which is an isolated part of the SOI layer in the shape of an island, is seen at the boundary between the SOI layer and the terrace. It is understood that the SOI island occurs at the transition area between a portion with a degree of flatness that allows the SOI layer to be transferred and a portion with a degree of flatness that does not allow the SOI layer to be transferred. It is feared that the SOI island is detached from the wafer in a device fabrication process, and re-attached to a device fabrication area as a silicon particle, resulting in device faults (See Patent Document 1).

In addition, in ion implantation separation method, since the width of the above terrace (terrace width) is determined depending on flatness of an area in which the terrace will be formed on a wafer to be bonded, it is difficult to control the terrace width after bonding. It is feared that if a laser mark and the like will be made at the terrace of an SOI wafer in a device process, for example, excessively narrow terrace width makes it impossible to make the laser mark.

To improve the SOI island and control the terrace width, there is a method of immersing a wafer after bonding in a solution containing hydrogen fluoride (HF) to etch an insulator film interposed between a bond wafer and a base wafer from the outer circumference (Patent Document 2).

CITATION LIST

Patent Literature

Patent Document 1: Japanese Unexamined Patent publication (Kokai) No. 2002-305292
Patent Document 2: Japanese Unexamined Patent publication (Kokai) No. 2010-199353
Patent Document 3: Japanese Unexamined Patent publication (Kokai) No. 2006-270039
Patent Document 4: Japanese Unexamined Patent publication (Kokai) No. 2006-216662
Patent Document 5: Japanese Unexamined Patent publication (translation of PCT Application) No. 2008-526038

SUMMARY OF INVENTION

Technical Problem

In manufacture of an SOI wafer having a thick buried insulator film by the ion implantation separation method, for example, since the accelerating voltage of an ion implantation apparatus limits separable film thickness, a bonding process is performed with the insulator film formed on the base wafer side.

In that case, if the method disclosed in Patent Document 2 is performed on a bonded wafer having the insulator film formed on the base wafer to improve the terrace, a part of the insulator film on the back surface of the base wafer, in addition to a part between the bond wafer and the base wafer, is removed, causing the problem in that an SOI wafer after separation has a large warp.

This is because the insulator film remains only on a bonded surface side of the base wafer, and the warp is caused by a difference in thermal expansion coefficients between the insulator film and silicon. The warp due to the insulator film becomes large in proportion to the film thickness of the insulator film. Inhibiting the warp is therefore a particularly important problem in the case of forming a thick insulator film on the base wafer.

Patent Document 3 discloses a spin etching as a method for removing a portion of an oxide film only on the front surface side of an SOI wafer without removing a portion of the oxide film on the back surface side of the base wafer.

Even when the spin etching is performed on the SOI wafer after separation, however, the occurrence of an SOI island on a terrace cannot be reduced and the outer circumferential edge of the SOI layer is formed into an overhang shape by the etching from the end face of a buried oxide film, so the edge is easy to detach.

Patent Document 4 discloses an outer circumferential portion of an oxide film formed on a bond wafer or a base wafer is previously removed before bonding to prevent the occurrence of the SOI island on the terrace of an SOI wafer manufactured by the ion implantation separation method and the wafers are then bonded. Patent Document 4 however has the disadvantage that the procedures for removing the outer circumferential portion of the oxide film before bonding is complicated.

In addition, the art disclosed in Patent Document 5 is the same as in Patent Document 2 in respect of etching of an oxide film after bonding, but differs from Patent Document 2 in the removal of the oxide film being a pretreatment for etching of silicon, which is called trimming. Besides there is no description of an SOI island, which is a problem inherent in the ion implantation separation method.

The present invention was accomplished in view of the above-described problems. It is an object of the present invention to provide a method for manufacturing an SOI wafer that can control the terrace width, prevent the occurrence of an SOI island, and inhibit warping of the SOI wafer in bonding processes with a base wafer having an insulator film formed thereon.

Solution to Problem

To achieve this object, the present invention provides a method for manufacturing an SOI wafer, comprising: implanting at least one gas ion selected from a hydrogen ion and a rare gas ion into a bond wafer composed of silicon single crystal from a surface of the bond wafer to form a layer of the implanted ion; bonding the surface from which the ion is implanted into the bond wafer and a surface of a base wafer through an insulator film; and then separating the bond wafer along the layer of the implanted ion to form the SOI wafer, wherein the insulator film is formed at least on all surfaces of the base wafer, and while protecting a first part of the insulator film, the first part being on a back surface on the opposite side from a bonded surface of the base wafer, a bonded wafer before separating the bond wafer along the layer of the implanted ion is brought into contact with a liquid capable of dissolving the insulator film or exposed to a gas capable of dissolving the insulator film, such that a second part of the insulator film is etched from an outer circumferential edge of the bonded wafer and toward the center of the bonded wafer, the second part being interposed between the bond wafer and the base wafer.

In this manner, the terrace width after separation can be controlled and the occurrence of an SOI island, which is a defect inherent in the ion implantation separation method, can be prevented, by etching the second part of the insulator film interposed between the bond wafer and the base wafer from the outer circumferential edge of the bonded wafer and toward the center of the bonded wafer. At the same time, warping of the SOI wafer can be inhibited by protecting the first part of the insulator film on the back surface of the base wafer during the etching of the insulator film.

In the method, it is preferable that after bonding the bond wafer and the base wafer at room temperature, the insulator film is etched without heat treatment.

In this manner, etching the insulator film without heat treatment enables prevention of separation of the bond wafer at the layer of the implanted ion before the etching of the insulator film. In addition to this, the terrace width can be more accurately controlled, and the occurrence of the SOI island can be prevented.

In the method, it is preferable that after bonding the bond wafer and the base wafer at room temperature, a heat treatment at a low temperature is performed such that the bond wafer is not separated along the layer of the implanted ion, and the insulator film is then etched.

The heat treatment at a low temperature enables prevention of separation of the bond wafer, improvement in bonding strength, and more accurate control of the terrace width, so that the occurrence of the SOI island can be prevented.

In the method, the second part of the insulator film is preferably etched up to a location from 0.3 mm to 10 mm away from the outer circumferential edge of the bonded wafer and toward the center of the bonded wafer.

The etching of the insulator film in the above range enables a proper terrace width for a laser mark and the like that will be made on the terrace in a device process. In addition, the occurrence of the SOI island can reliably be prevented.

During the etching of the insulator film, the first part of the insulator film on the back surface on the opposite side from the bonded surface of the base wafer is preferably protected within the inside of a location from 0 mm to 20 mm away from the outer circumferential edge of the base wafer and toward the center of the base wafer.

The protection in the above range enables the warping after separation to be effectively inhibited.

In the method, the first part of the insulator film on the back surface on the opposite side from the bonded surface of the base wafer is preferably protected with an O-ring.

With the O-ring, the insulator film on the back surface can reliably be protected in a simple manner.

In the method, the insulator film is any one of an oxide film, a nitride film, and a stacked layer film thereof, and the liquid capable of dissolving the insulator film is preferably a solution containing hydrogen fluoride (HF).

Use of a solution containing HF for this insulator film enables the insulator film to be more efficiently etched.

The bond wafer is preferably, after the bonded wafer subjected to the etching of the insulator film is immersed in a liquid capable of dissolving single crystal silicon or exposed to a gas capable of dissolving single crystal silicon such that an outer circumferential portion of the bond wafer is etched up to a depth from the bonded surface of the bond wafer to at least the layer of the implanted ion.

Such Si etching enables a part that will become an extraneous particle in a device fabrication process to be previously removed.

Advantageous Effects of Invention

As described above, the present invention can control the terrace width, prevent the occurrence of an SOI island, and inhibit warping of the SOI wafer, in bonding processes with a base wafer having an insulator film formed thereon.

DESCRIPTION OF EMBODIMENTS

The present inventors considered how to inhibit an SOI island, which is an inherent defect that may occur when an SOI wafer is manufactured by the ion implantation separation method, and consequently conceived as follows. A region with a low bonding strength, which may be a cause of the occurrence of an SOI island, is eliminated by etching an insulator film interposed between a bond wafer and a base wafer to some extent from the outer circumferential edge toward the center before the bond wafer is separated; halfway transfer of an SOI layer can therefore be prevented in a region where the SOI island is easy to occur; in this region, the occurrence of the transfer of the SOI layer can reliably be prevented, so the occurrence of the SOI island can be prevented.

For this purpose, a bonded wafer needs to be immersed in an etching solution for an insulator film, such as hydrofluoric acid before the bond wafer is separated. As disclosed in JPH10-70054A, for example, it was previously understood that since it is feared that immersing a bonding interface in the state of a low bonging strength in an etching solution causes the etching solution to erode the bonding interface, a bonding heat treatment at a high temperature (for example, 1000° C. or more) is needed before the immersion in an etching solution.

When the ion implantation separation method is used, however, such a high-temperature heat treatment before etching causes the separation of the bond wafer at the layer of the implanted ions, so the SOI island cannot be consequently prevented. The present inventors accordingly investigated how far the etching of a silicon oxide film at the bonding interface proceeds when immersed in an etching solution after the bonding at room temperature, and consequently found that the etching at the bonding interface between a silicon oxide film and bare silicon proceeds only about 10 mm from the outer circumference, even when the oxide film is immersed in a 50% HF containing solution for one day (24 hours).

Figure 2:
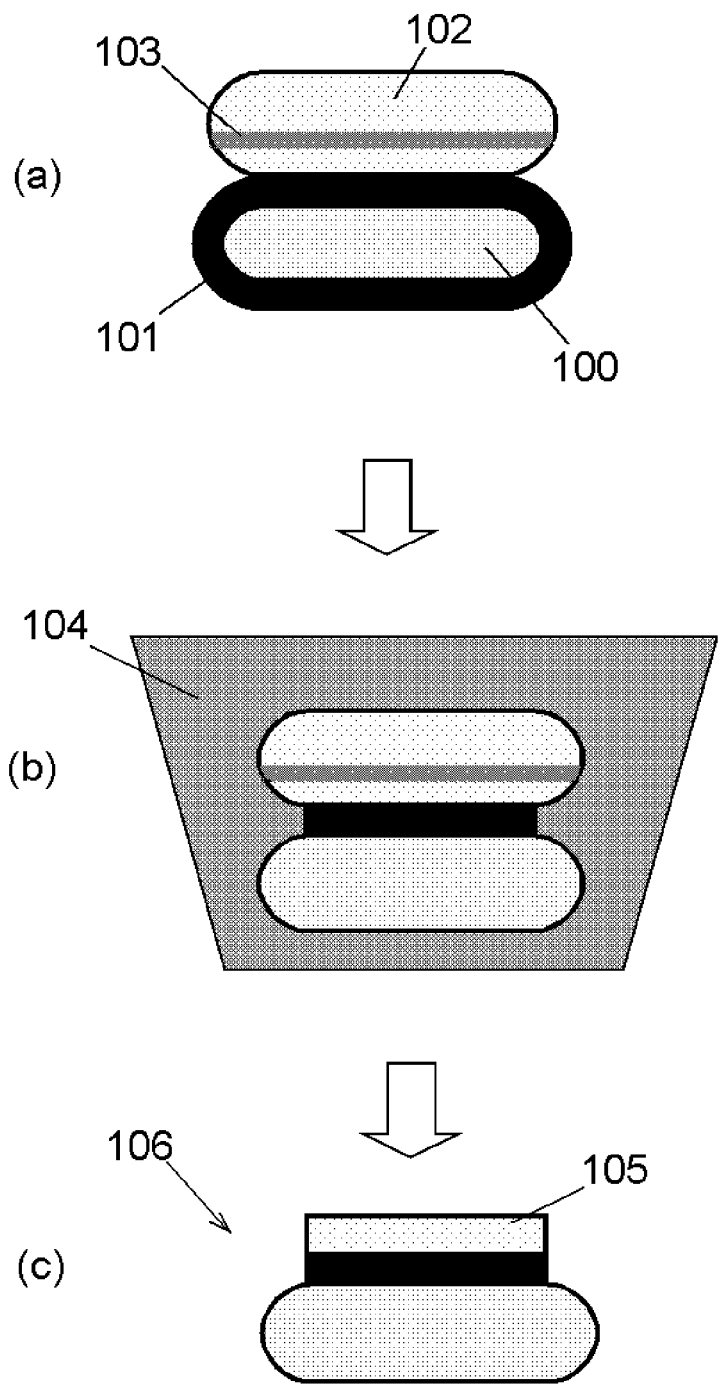
FIG. 2 is a flow chart of a conventional method for manufacturing an SOI wafer.

On the other hand, it was found that when an insulator film is formed on the base wafer side and the above etching is performed according to Patent Document 2, an SOI wafer warps after separation. As shown in FIG. 2, when a bond wafer 102 in which a layer 103 of implanted ions is formed and a base wafer 100 on which an insulator film 101 is formed are bonded together (FIG. 2 at (a)), and the resultant is immersed in an HF containing solution 104 to etch the insulator film 101 at the bonding interface (FIG. 2 at (b)), a part of the insulator film on the back surface of the base wafer 100 is also removed, so after the bond wafer 102 is separated along the layer 103 of implanted ions to form an SOI layer 105, an SOI wafer 106 in which the insulator film has been removed from the back surface of the base wafer 100 is obtained (FIG. 2 at (c)).

In this case, warping occurs due to a difference in thermal expansion coefficients between the insulator film and silicon as described above.

The insulator film needs to remain on the back surface of the base wafer to inhibit this warping. The inventors considered how to prevent the occurrence of an SOI island on a terrace while inhibiting the occurrence of warping, and found that both the prevention of the occurrence of the SOI island and the inhibition of the warping can be achieved by etching a part of the insulator film between the bond wafer and the base wafer while protecting a part of the insulator film on the back surface of the base wafer before the bond wafer is separated; thereby the present invention has been completed.

An embodiment of the present invention will now be described in detail with reference to figures, but the present invention is not limited to this embodiment.

Figure 1:
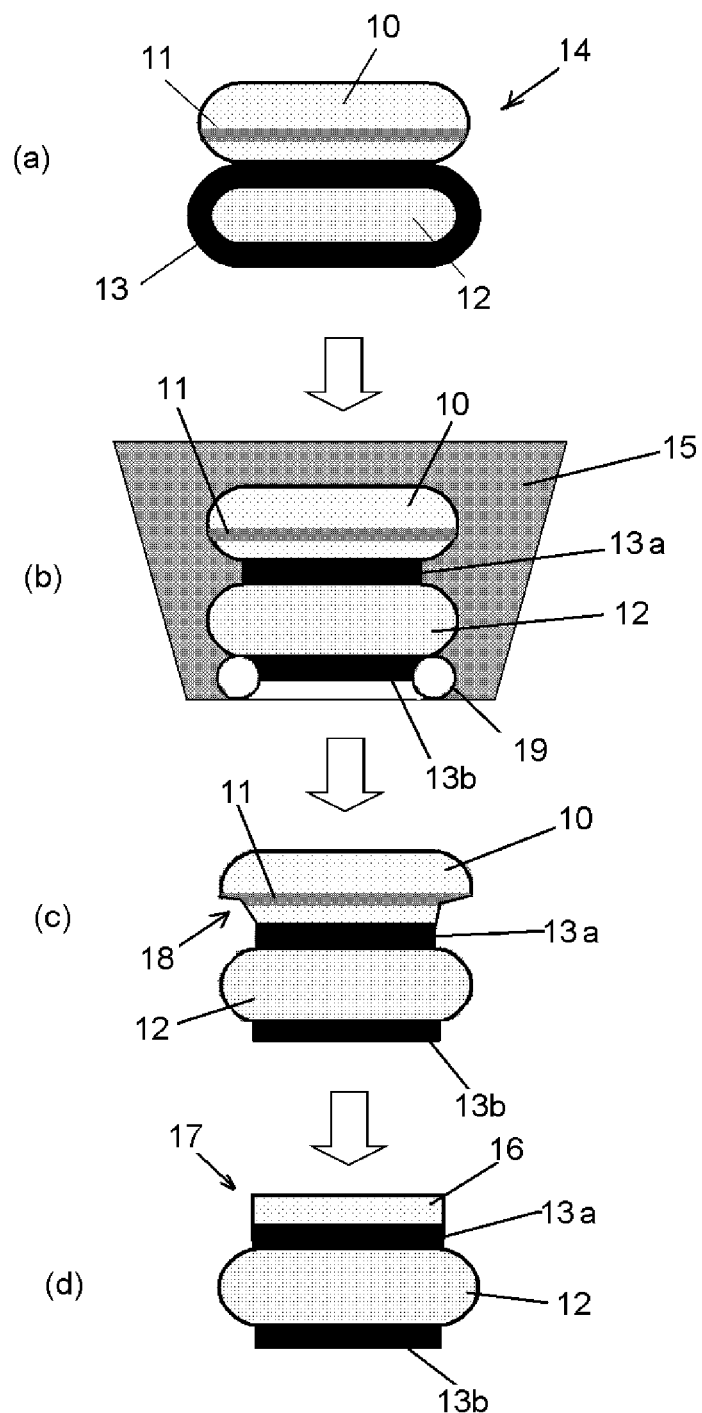
FIG. 1 is a flow chart of an embodiment of the inventive method for manufacturing an SOI wafer.

FIG. 1 shows a flow chart of the inventive method for manufacturing an SOI wafer.

First, at least one type of gas ions selected from the group consisting of hydrogen ions and rare gas ions are implanted into a bond wafer composed of silicon single crystal from a surface of the bond wafer to form a layer of the implanted ions. Moreover, the insulator film is formed at least on all surfaces of a base wafer. In the present invention, the insulator film may be formed only on the base wafer. It is also permissible to form insulator films on both the base wafer and the bond wafer.

The insulator film to be formed is not particularly limited, but typically an oxide film or a nitride film, or may also be a stacked layer film thereof.

As shown in FIG. 1 at (a), the surface from which the ions are implanted into the bond wafer 10 having the layer 11 of the implanted ions formed thereon and a surface of the base wafer 12 are bonded through the insulator film 13 at room temperature to form a bonded wafer 14.

A plasma treatment may also be performed on a surface to be bonded of at least one of the wafers before bonding to increase the bonding strength obtained at room temperature.

After the above bonding process, it is preferable not to perform any heat treatment or to perform a heat treatment at a low temperature (for example, 200 to 350° C.) that does not cause separation of the bond wafer 10 at the layer 11 of the implanted ions, before a subsequent etching process.

In this way, the separation of the bond wafer before etching, which is concerned when a conventional ion implantation separation method is used, can be prevented. In addition, the terrace width can more accurately be controlled.

After that, as shown in FIG. 1 at (b), while a part 13b of the insulator film, which is on the back surface on the opposite side from the bonded surface of the base wafer 12, is protected, the bonded wafer 14 is brought into contact with a liquid capable of dissolving the insulator film or exposed to a gas capable of dissolving the insulator film; a part 13a of the insulator film, which is interposed between the bond wafer 10 and the base wafer 12, is thereby etched from the outer circumferential edge of the bonded wafer 14 and toward the center of the bonded wafer.

The etching may be performed by immersing the bonded wafer in an etching solution 15 (a liquid capable of dissolving the insulator film), as shown in FIG. 1 at (b), or exposing the bonded wafer to steam capable of dissolving the insulator film.

If the insulator film is an oxide film, then an HF containing solution is preferable as the etching solution 15, but buffered hydrofluoric acid, an $HF/H_2O_2/CH_3COOH$ solution, and an $HF/HNO_3$ solution may also be used. If the insulator film is a nitride film, then phosphoric acid is preferably used.

The part 13b of the insulator film on the back surface of the base wafer 12 can be protected by bringing the entire circumferential portion near the outer edge of the back surface of the base wafer 12 into contact with a ring-shaped rubber 19 (an O-ring) to block the etching solution or the etching gas, as shown in FIG. 1 at (b), or attaching a protective sheet, such as PVC, to the part 13b of the insulator film on the back surface of the base wafer 12. A possible alternative way is that the back surface of the base wafer 12 is held by suction, and while the bonded wafer 14 is horizontally oriented and rotated, the etching solution or the etching gas is supplied from above the bond wafer 10 and a non-etching gas is supplied on the back surface side of the base wafer 12, such that the etching solution or the etching gas does not reach the back surface of the base wafer because of wind pressure of the non-etching gas and centrifugal force generated by the rotation of the bonded wafer 14.

The insulator film at the bonding interface is eroded from its outer circumferential edge by this etching. At a portion where the insulator film has been eroded, the bond wafer and the base wafer are not bonded; when the bond wafer is separated, an SOI layer is not transferred at the eroded portion, so a terrace is formed thereon. At a region where the insulator film remains, on the other hand, the SOI layer is transferred by the separation. In other words, the width of the erosion due to the above etching equals the terrace width. In contrast, the part of the insulator film on the back surface of the base wafer is not etched because of the protection by the O-ring and so on.

The SOI island occurs at a boundary portion between the SOI layer and the terrace. The boundary portion corresponds to an outer circumferential portion of a wafer to be bonded and has poor flatness, so this portion is a region where the SOI layer is only partially transferred because the portion has low bonding strength. The prevention of the occurrence of the SOI island needs to widen the erosion width of the insulator film by the above etching of the insulator film up to the region where the SOI island may occur and thereby to etch the above portion having low bonding strength; this prevents the transfer of the SOI layer at this region, thereby reliably eliminating the occurrence of the SOI island.

The erosion width from the outer circumference of the insulator film by the above etching of the insulator film varies depending on the type of insulator film, and the type, concentration, and temperature of the etching solution or etching gas. Under the same conditions, however, since the erosion width can be controlled by etching time, the terrace width after the transfer of the SOI layer can also be controlled by adjustment of these conditions.

The part 13a of the insulator film is preferably etched, for example, up to a location from 0.3 mm to 10 mm away from the outer circumferential edge of the bonded wafer 14 and toward the center of the bonded wafer.

Adjustment of this erosion width enables the above region where the SOI island is easy to occur to be etched and removed, enabling the occurrence of the SOI island to be reliably prevented by adjustment of the terrace width. A chamfer portion with a width of about several hundred micrometers is typically formed on the outer circumferential edge of a bond wafer 10 and a base wafer 12 that will form a bonded wafer 14. Since this chamfer portion is not bonded and does not form the SOI island thereon, the erosion width is more preferably 0.5 mm or more and, in view of an effective area of the SOI layer, more preferably 3 mm or less.

The range of protection of the back surface of the base wafer 12 is not particularly limited; several millimeters from the outer circumference is desirable to inhibit the occurrence of warping of the base wafer 12. Depending on a permissible level of warping, however, it may be protected within the inside of this range. A preferable protection range is, for example, within the inside of a location from 0 mm to 20 mm away from the outer circumferential edge of the base wafer 12 and toward the center of the base wafer. This protection range can be adjusted, for example, by providing the O-ring 19 at a position from 0 mm to 20 mm away from the outer circumferential edge of the base wafer 12 and toward the center of the base wafer.

The protected insulator film remaining in this range enables reliable inhibition of warping of a manufactured SOI wafer.

As shown in FIG. 1 at (c), the bonded wafer 14 subjected to the etching of the insulator film 13a as above is then immersed in a liquid capable of dissolving silicon single crystal or exposed to a gas capable of dissolving silicon single crystal. The outer circumferential portion 18 of the bond wafer 10 is thereby etched up to a depth from the bonded surface of the bond wafer to at least the layer 11 of the implanted ion. This etching is also preferable.

Such Si etching of the outer circumferential portion of the bond wafer enables a part that will become an extraneous particle in a device fabrication process to be previously removed. The occurrence of the SOI island is thereby prevented more reliably. In addition, since the layer of the implanted ions in the outer circumferential portion of the bond wafer is removed, blistering (a phenomenon of the occurrence of a swell) on the outer circumferential portion does not occur even when a heat treatment is performed in a subsequent process. Si swarf caused by the blistering can therefore be prevented from attaching to the terrace of the SOI wafer. It is to be noted that since attached Si swarf is not bonded to a base wafer unlike the SOI island, the swarf can be removed by general cleaning to some extent, but it is hard to completely remove the swarf. It is accordingly desirable to inhibit the attachment of Si swarf as possible by the above Si etching of the outer circumferential portion.

Examples of the liquid capable of dissolving silicon single crystal include a tetramethyl ammonium hydroxide (TMAH) solution. This is not a limitation, provided a liquid or gas capable of dissolving silicon single crystal is used.

Before this Si etching, an outer circumferential portion of the bond wafer and the base wafer that is outside a desired range in which the Si etching is performed is preferably protected in advance by a mask to prevent excessive etching thereof.

As shown in FIG. 1 at (d), a separation heat treatment, for example, at 400° C. or more is then performed to separate the bond wafer 10 along the layer 11 of the implanted ions so that an SOI wafer 17 having an SOI layer 16 formed on the insulator film (buried insulator film) 13a is manufactured.

The present invention can control the terrace width, prevent the occurrence of an SOI island, inhibit increase in warping after separation, and thereby manufacture a high quality SOI wafer.

EXAMPLE

The present invention will be now more specifically described with reference to Examples and Comparative Examples, but the present invention is not limited to these examples.

Examples 1, 2 and Comparative Examples 1, 2

In Example 1, a 300-mm-diameter silicon single crystal wafer (a bond wafer) and a 300-mm-diameter silicon single crystal wafer (a base wafer) in which a 150-nm-thickness thermal oxide film is formed on all surfaces were bonded at room temperature (25° C.). After the bonding, while a part of the oxide film on the back surface of the base wafer was protected by an O-ring, an HF process (immersion in a 50% HF solution) was performed (the step at (b) in FIG. 1). A separation heat treatment was then performed to separate the bond wafer so that an SOI wafer was manufactured.

In Example 2, an SOI wafer was manufactured as in Example 1 except that Si etching of the outer circumferential portion of the bond wafer by TMAH was added after the HF process (the step at (c) in FIG. 1).

In Comparative Example 1, an SOI wafer was manufactured as in Example 1 except that after bonding, a separation heat treatment was performed to separate a bond wafer without performing the HF process.

In Comparative Example 2, an SOI wafer was manufactured as in Example 1 except that after bonding, the HF process (immersion in a 50% HF solution) was performed without protecting the back surface of the base wafer (the step at (b) in FIG. 2), and a separation heat treatment was then performed to separate the bond wafer.

Table 1 shows the conditions and evaluation results of Examples 1, 2 and Comparative Examples 1, 2.

TABLE 1

|  | EXAMPLE 1 | EXAMPLE 2 | COMPARATIVE EXAMPLE 1 | COMPARATIVE EXAMPLE 2 |
|---|---|---|---|---|
| THERMAL OXIDE FILM THICKNESS (BASE WAFER) | Ox = 150 nm | Ox = 150 nm | Ox = 150 nm | Ox = 150 nm |
| ION IMPLANTATION CONDITION (BOND WAFER) | 40 keV, 6e16 cm$^{-2}$ | 40 keV, 6e16 cm$^{-2}$ | 40 keV, 6e16 cm$^{-2}$ | 40 keV, 6e16 cm$^{-2}$ |
| BONDING TEMPERATURE | ROOM TEMPERATURE | ROOM TEMPERATURE | ROOM TEMPERATURE | ROOM TEMPERATURE |
| HF PROCESS | 50% HF solution, 10 min (*1) | 50% HF solution, 60 min (*2) | NONE | 50% HF solution, 10 min (*3) |

TABLE 1-continued

|  | EXAMPLE 1 | EXAMPLE 2 | COMPARATIVE EXAMPLE 1 | COMPARATIVE EXAMPLE 2 |
|---|---|---|---|---|
| Si ETCHING | NONE | (*4) | NONE | NONE |
| SEPARATION HEAT TREATMENT, SEPARATION | 500° C., 30 min | 500° C., 30 min | 500° C., 30 min | 500° C., 30 min |
| OXIDE FILM ON BACK SURFACE | EXISTED | EXISTED | EXISTED | NO EXISTED (REMOVED) |
| WARP | 10 µm | 10 µm | 10 µm | 40 µm |
| TERRACE OBSERVATION AFTER SEPARATION (OPTICAL MICROSCOPE) | TERRACE WIDTH: 1.1 mm, NO SOI ISLAND EXISTED | TERRACE WIDTH: 1.1 mm, NO SOI ISLAND EXISTED | TERRACE WIDTH: 1.0 mm, SOI ISLAND EXISTED | TERRACE WIDTH: 1.1 mm, NO SOI ISLAND EXISTED |

(*1) The oxide film on the back surface was protected in the range between the wafer center and 3 mm away from the outer circumferential edge.
(*2) The oxide film on the back surface was protected in the range between the wafer center and 5 mm away from the outer circumferential edge.
(*3) There was no protection of the oxide film on the back surface.
(*4) Si in the outer circumferential portion of the bond wafer was etched by 2 µm by a TMAH solution.

As shown in Table 1, the occurrence of an SOI island was able to be prevented by the etching in the present invention. In addition, warping was able to be inhibited by leaving the oxide film on the back surface of the base wafer. In Comparative Example 1 in which the HF process was not performed, on the other hand, the SOI island was detected. In Comparative Example 2 in which the HF process was performed without protecting the oxide film on the back surface of the base wafer, large warp occurred.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer, comprising:
   implanting at least one gas ion selected from a hydrogen ion and a rare gas ion into a bond wafer composed of silicon single crystal from a surface of the bond wafer to form a layer of the implanted ion;
   bonding the surface from which the ion is implanted into the bond wafer and a surface of a base wafer through an insulator film; and then
   separating the bond wafer along the layer of the implanted ion to form the SOI wafer, wherein
   the insulator film is formed at least on all surfaces of the base wafer, and while protecting a first part of the insulator film, the first part being on a back surface on the opposite side from a bonded surface of the base wafer, a bonded wafer before separating the bond wafer along the layer of the implanted ion is brought into contact with a liquid capable of dissolving the insulator film or exposed to a gas capable of dissolving the insulator film, such that a second part of the insulator film is etched from an outer circumferential edge of the bonded wafer and toward the center of the bonded wafer, the second part being interposed between the bond wafer and the base wafer.

2. The method for manufacturing an SOI wafer according to claim 1, wherein after bonding the bond wafer and the base wafer at room temperature, the insulator film is etched without heat treatment.

3. The method for manufacturing an SOI wafer according to claim 1, wherein after bonding the bond wafer and the base wafer at room temperature, a heat treatment at a low temperature is performed such that the bond wafer is not separated along the layer of the implanted ion, and the insulator film is then etched.

4. The method for manufacturing an SOI wafer according to claim 1, wherein the second part of the insulator film is etched up to a location from 0.3 mm to 10 mm away from the outer circumferential edge of the bonded wafer and toward the center of the bonded wafer.

5. The method for manufacturing an SOI wafer according to claim 2, wherein the second part of the insulator film is etched up to a location from 0.3 mm to 10 mm away from the outer circumferential edge of the bonded wafer and toward the center of the bonded wafer.

6. The method for manufacturing an SOI wafer according to claim 3, wherein the second part of the insulator film is etched up to a location from 0.3 mm to 10 mm away from the outer circumferential edge of the bonded wafer and toward the center of the bonded wafer.

7. The method for manufacturing an SOI wafer according to claim 1, wherein during the etching of the insulator film, the first part of the insulator film on the back surface on the opposite side from the bonded surface of the base wafer is protected within the inside of a location from 0 mm to 20 mm away from the outer circumferential edge of the base wafer and toward the center of the base wafer.

8. The method for manufacturing an SOI wafer according to claim 2, wherein during the etching of the insulator film, the first part of the insulator film on the back surface on the opposite side from the bonded surface of the base wafer is protected within the inside of a location from 0 mm to 20 mm away from the outer circumferential edge of the base wafer and toward the center of the base wafer.

9. The method for manufacturing an SOI wafer according to claim 3, wherein during the etching of the insulator film, the first part of the insulator film on the back surface on the opposite side from the bonded surface of the base wafer is protected within the inside of a location from 0 mm to 20 mm away from the outer circumferential edge of the base wafer and toward the center of the base wafer.

10. The method for manufacturing an SOI wafer according to claim 4, wherein during the etching of the insulator film, the first part of the insulator film on the back surface on the opposite side from the bonded surface of the base wafer is protected within the inside of a location from 0 mm to 20 mm away from the outer circumferential edge of the base wafer and toward the center of the base wafer.

11. The method for manufacturing an SOI wafer according to claim 1, wherein the first part of the insulator film on the back surface on the opposite side from the bonded surface of the base wafer is protected with an O-ring.

12. The method for manufacturing an SOI wafer according to claim 1, wherein the first part of the insulator film on the back surface on the opposite side from the bonded surface of the base wafer is protected with an O-ring.

13. The method for manufacturing an SOI wafer according to claim 3, wherein the first part of the insulator film on the back surface on the opposite side from the bonded surface of the base wafer is protected with an O-ring.

14. The method for manufacturing an SOI wafer according to claim 4, wherein the first part of the insulator film on the back surface on the opposite side from the bonded surface of the base wafer is protected with an O-ring.

15. The method for manufacturing an SOI wafer according to claim 7, wherein the first part of the insulator film on the back surface on the opposite side from the bonded surface of the base wafer is protected with an O-ring.

16. The method for manufacturing an SOI wafer according to claim 1, wherein the insulator film is any one of an oxide film, a nitride film, and a stacked layer film thereof, and the liquid capable of dissolving the insulator film is a solution containing hydrogen fluoride (HF).

17. The method for manufacturing an SOI wafer according to claim 15, wherein the insulator film is any one of an oxide film, a nitride film, and a stacked layer film thereof, and the liquid capable of dissolving the insulator film is a solution containing hydrogen fluoride (HF).

18. The method for manufacturing an SOI wafer according to claim 1, wherein the bond wafer is separated, after the bonded wafer subjected to the etching of the insulator film is immersed into a liquid capable of dissolving single crystal silicon or exposed to a gas capable of dissolving single crystal silicon such that an outer circumferential portion of the bond wafer is etched up to a depth from the bonded surface of the bond wafer to at least the layer of the implanted ion.

19. The method for manufacturing an SOI wafer according to claim 17, wherein the bond wafer is separated, after the bonded wafer subjected to the etching of the insulator film is immersed into a liquid capable of dissolving single crystal silicon or exposed to a gas capable of dissolving single crystal silicon such that an outer circumferential portion of the bond wafer is etched up to a depth from the bonded surface of the bond wafer to at least the layer of the implanted ion.

\* \* \* \* \*